United States Patent [19]
Aoyagi et al.

[11] Patent Number: 5,185,290
[45] Date of Patent: Feb. 9, 1993

[54] METHOD OF COATING FACET OF SEMICONDUCTOR OPTICAL ELEMENT

[75] Inventors: Toshitaka Aoyagi; Kimio Shigihara, both of Itami, Japan

[73] Assignee: Mitsubishi Denki Kabushiki Kaisha, Tokyo, Japan

[21] Appl. No.: 561,720

[22] Filed: Aug. 1, 1990

[30] Foreign Application Priority Data

Aug. 17, 1989 [JP] Japan ............................ 1-212743

[51] Int. Cl.$^5$ ............................................. H01L 21/20
[52] U.S. Cl. ................................... 437/129; 437/228; 437/905; 148/DIG. 95; 148/DIG. 99
[58] Field of Search ............... 437/129, 228, 905; 148/DIG. 95, DIG. 99

[56] References Cited

U.S. PATENT DOCUMENTS

| | | | |
|---|---|---|---|
| 3,851,379 | 12/1974 | Gutknecht et al. | 437/228 |
| 4,337,115 | 6/1982 | Ikeda et al. | 437/228 |
| 5,063,173 | 11/1991 | Gasser et al. | 437/129 |

FOREIGN PATENT DOCUMENTS

| | | |
|---|---|---|
| 3636336 | 4/1987 | Fed. Rep. of Germany . |
| 3611167 | 10/1987 | Fed. Rep. of Germany . |
| 62-98320 | 5/1987 | Japan . |
| 62-147790 | 7/1987 | Japan . |

OTHER PUBLICATIONS

S. M. Sze, "VLSI Technology", McGraw Hill International Book Company, 1983, pp. 430-435.

*Primary Examiner*—Brian E. Hearn
*Assistant Examiner*—Linda J. Fleck
*Attorney, Agent, or Firm*—Leydig, Voit & Mayer

[57] ABSTRACT

A method of selectively coating one of two spaced apart facets of respective light-emitting regions on the same surface of a semiconductor device formed in a semiconductor wafer includes forming at least one first groove in a wafer and forming at least one second groove in the wafer intersecting the first groove, exposing light-emitting region facets on a side wall surface of the second groove. A stream of an evaporated coating material is directed across an edge, formed by the intersection of a side wall surface of the second groove with the first groove, at an angle relative to the wafer surface so that the edge shadows one of the light-emitting region facets but not the other. After the coating process, the wafer is divided into individual devices that may include adjacent, differently coated light-emitting region facets. The invention avoids a mechanical mask alignment step by employing in the coating process first grooves that are self aligning relative to the light-emitting region facets.

19 Claims, 8 Drawing Sheets

METHOD OF COATING FACET OF SEMICONDUCTOR OPTICAL ELEMENT

FIELD OF THE INVENTION

The present invention relates to a method of selectively applying one or more coatings to facets of light-emitting regions of semiconductor devices. The invention is particularly useful in simultaneously coating with different coatings a large number of closely spaced light-emitting region facets on the same surface, for example, in a plurality of semiconductor laser arrays formed in a semiconductor wafer before the wafer is divided into individual arrays.

BACKGROUND OF THE INVENTION

FIG. 8 illustrates a conventional method of selectively coating alternating light-emitting facets disposed on the same surface of an array of semiconductor lasers. In FIG. 8, a laser device 1 includes two lasers, one laser having a light-emitting region 2 for emitting a relatively high power output light beam. The other laser includes a relatively low power, low noise light-emitting region 3. The facets of the light-emitting regions at surface 4 through which light is emitted are selectively coated with different coatings. In FIG. 8, the light-emitting region 2 facet at surface 4 is coated with a relatively low reflectance film while no coating is deposited on the relatively low power light-emitting region 3 facet on surface 4. The individual laser device 1 is manufactured as one of a relatively large number of such devices in a semiconductor wafer or bar 6 in FIG. 8. It is desirable to coat each of the relatively high power light-emitting region facets in a single step.

As illustrated in FIG. 8, each of the light-emitting region 2 facets on surface 4 is simultaneously coated by positioning a mask 8 having a regular pattern of openings so that one of the openings is aligned with each of the high power light-emitting region facets. A source of coating material 7 is then evaporated and the evaporated material 9 passes through the openings in mask 8 to deposit the coating 5 without coating the low power light-emitting region 3 facets on surface 4.

The process illustrated in FIG. 8 requires that the openings in mask 8 be accurately aligned with light-emitting region 2 facets. This registration is difficult to achieve since the light-emitting regions are typically only a few microns in width and the separation between light-emitting regions 2 and 3 may be as small as only a few microns. Therefore, a slight misalignment in the mask relative to the light-emitting regions can result in improper coating of many or all of the simultaneously coated light-emitting region facets.

SUMMARY OF THE INVENTION

It is an object of the present invention to provide a method of selectively coating selected light-emitting region facets on the same surface that includes a plurality of light-emitting region facets so that the selected facets are simultaneously coated without the necessity of mechanically aligning a separate mask with the selected light-emitting region facets.

It is another object of the invention to provide a method for selectively coating light-emitting region facets on the same surface in a plurality of semiconductor devices while the devices are still in a wafer state, i.e., before being separated into individual devices.

In accordance with one aspect of the present invention, after layers for forming a plurality of semiconductor light-emitting devices, each device including at least two spaced apart light-emitting region facets on the same surface, are formed in a wafer, a first groove extending to a first depth is formed in the wafer. Thereafter, a second groove, transverse to, intersecting, and deeper than the first groove, is formed in the wafer to expose the light-emitting region facets on a side wall surface of the second groove. The first groove is aligned with one of the light-emitting region facets. The surface of the wafer and a side wall surface of the second groove intersect to form an edge that intersects the first groove. Thereafter, a stream of evaporated coating material is directed across the first edge at such an angle relative to the surface of the wafer that the edge shadows one of the light-emitting region facets on the opposite side wall surface and prevents the coating material from reaching it while the coating material flows through the first groove at the edge and coats the light-emitting region facet on the side wall surface that is opposite the first groove.

According to another aspect of the invention, after layers for forming a plurality of semiconductor light-emitting devices, each including at least two spaced apart light-emitting region facets on the same surface, are formed in a wafer, a first groove extending to a first depth is formed in the wafer. Thereafter, a second groove, transverse to, intersecting, and deeper than the first groove, is formed in the wafer to expose the light-emitting region facets on a side wall surface of the second groove. The first groove is aligned with one of the light-emitting region facets. The surface of the wafer and the side wall surface of the second groove intersect to form an edge that intersects the first groove. A stream of an evaporated first coating material is directed across the edge at a first, relatively large angle with respect to the surface of the wafer so that the first coating material reaches and coats both of the light-emitting region facets on the opposite side wall surface. A stream of a second evaporated coating material is directed across the edge at a second, relatively small angle with respect to the surface of the wafer so that the edge shadows one of the light-emitting region facets on the opposite side wall surface and prevents the second coating material from reaching it while the second coating material flows through the first groove at the edge and reaches and coats the light-emitting region facet that is opposite the first groove on the side wall surface.

According to a third aspect of the invention, only a portion of a facet of a relatively wide light-emitting region of one or more semiconductor devices in a wafer is coated. After preparing a plurality of layers in a semiconductor wafer for forming a plurality of light-emitting semiconductor devices, each having a relatively wide light-emitting region facet, a first groove extending to a first depth from the surface of the semiconductor wafer is formed. A second groove transverse to, intersecting, and deeper in the semiconductor wafer than the first groove exposes on a side wall surface at least one of the relatively wide light-emitting region facets of the device. The first groove is narrower than and is aligned with a portion of the relatively wide light-emitting region facet opposite a side wall surface of the second groove. That side wall surface of the groove intersects the wafer surface to define an edge intersecting the first groove. Thereafter, a stream of an evaporated coating material is directed across the edge at a first, relatively low angle with respect to the surface of the wafer so that the edge shadows at least a portion of the relatively wide light-emitting region facet on the opposite side wall surface and prevents the coating material from reaching that portion of the light-emitting region facet on that side wall surface while the first coating material simultaneously flows through the first groove at the edge and reaches and coats the remainder of the light-emitting region facet on that side wall surface.

In accordance with the invention, the first grooves are aligned with respective light-emitting region facets using conventional semiconductor device fabrication techniques. Mechanical registration of a separate mask with a plurality of light-emitting region facets on the same surface is unnecessary in the invention. Moreover, many light-emitting region facets can be simultaneously and selectively coated in accordance with the invention.

Other objects and advantages of the present invention will become apparent from the detailed description given hereinafter. It should be understood, however, that the detailed description and specific embodiments are given by way of illustration only, since various changes and modifications within the spirit and scope of the invention will become apparent from the detailed description.

DETAILED DESCRIPTION OF PREFERRED EMBODIMENTS

Figure 1:
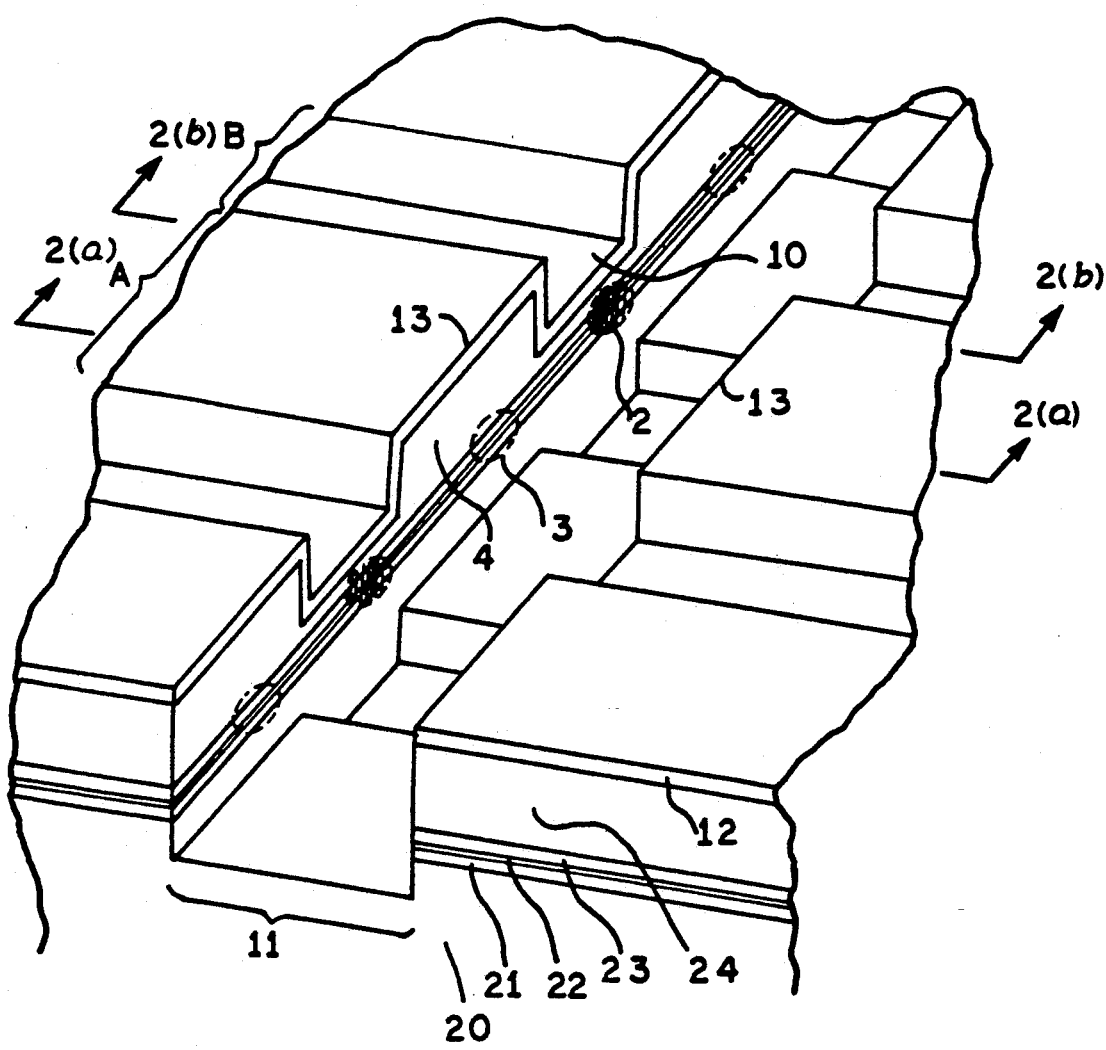
FIG. 1 is a perspective view of a portion of a semiconductor wafer for forming a plurality of light-emitting devices and prepared for coating according to an embodiment of the invention.
Figure 8:
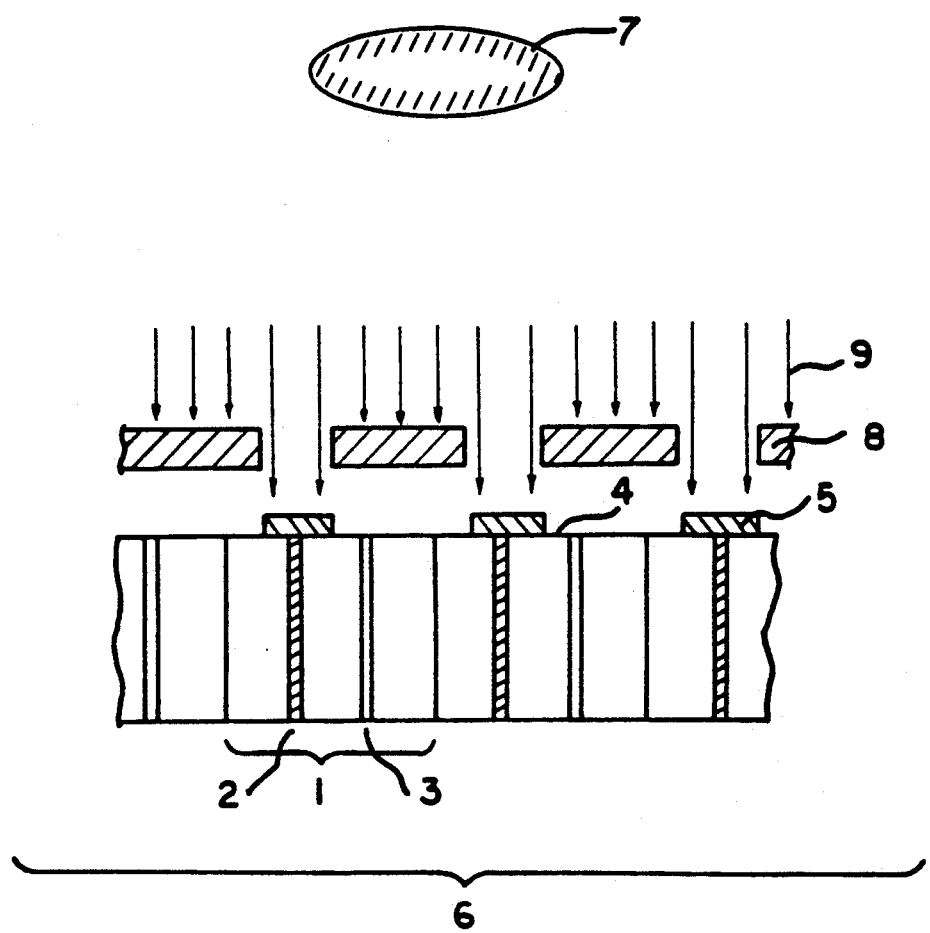
FIG. 8 is a schematic view illustrating a conventional method of selectively coating light-emitting surface regions of semiconductor light-emitting device arrays.

In FIG. 1, a portion of a wafer 20 on which layers 21, 22, 23, and 24 have been deposited and in which intersecting, transverse grooves 10 and 11 have been formed is shown. The layers 21, 22, 23, and 24 are formed by conventional processes, such as epitaxial growth and diffusion, for manufacturing a plurality of semiconductor laser devices. In the embodiment shown, each semiconductor device, after it is separated from the wafer, will include two light-emitting regions 2 and 3 disposed adjacent each other and having adjacent facets on the same surface. The light produced by oscillation in the respective light-emitting regions is emitted from the devices through the respective facets. As described with respect to FIG. 8, light-emitting region 2 may be part of a relatively high power output laser and an adjacent light-emitting region 3 may be a relatively low power output, low noise laser. This type of semiconductor laser including two light-emitting region facets on one surface is commonly used with optical memory discs. The relatively high power output light beam is used for recording information in the memory disc whereas the relatively low power output light beam is used for reading recorded information from the memory disc. Typically, such laser structures include cladding layers 21 and 23 sandwiching an active layer 22. A contacting layer 24 is disposed on the cladding layer at the front surface of the wafer. As shown in FIG. 1, a large number of light-emitting semiconductor devices, each device including a high power light-emitting region 2 and a low power light-emitting region 3 having facets lying on the same surface, is formed in wafer 20. The individual devices are separated from each other after the coating process described below has been completed.

After the formation of the layers 21–24, at least one groove 10 is formed at the front surface in the wafer by conventional means, such as wet or dry etching. As shown in FIG. 1, a plurality of linear, general parallel grooves 10 may be formed simultaneously. The grooves are aligned with what will become the facets of light-emitting regions 2. In other words, the width of each groove is wider than that of a facet of a light-emitting region 2 and is disposed directly between what will become the facet of that light-emitting region 2 and the front surface of the wafer. The depth of grooves 10 is controlled so that the grooves do not encroach upon the light-emitting regions.

After grooves 10 are formed, a photoresist layer 12 is deposited on the surface of the substrate. A pattern is formed in the photoresist layer 12 for forming a groove 11 that is transverse to and intersects the grooves 10. Before the photoresist layer 12 is deposited, it is desirable to deposit electrodes on the surface of the wafer. This step is preferably carried out before the exposure of the surfaces including the light-emitting region facets that occurs when groove 11 is etched, as described below.

The wafer is subsequently etched, using the photoresist as a mask, to form groove 11, including side wall surfaces 4, in the wafer. The side wall surfaces 4 are generally perpendicular to the front surface of the wafer and include facets of the light-emitting regions 2 and 3. Because of the prior formation of grooves 10, the bottom surface of groove 11 includes a deeper portion at each intersection with a groove 10. Generally, the depth of groove 11 is larger than that of grooves 10. The side wall surfaces 4 intersect the front surface of the wafer, including the grooves 10, to define edges 13. These edges 13 are notched or crenelated like a battlement because of the presence of grooves 10. Although only one groove 11 is shown in FIG. 1, a plurality of grooves 11 can be formed, just as more than one groove 10 is shown in FIG. 1.

Figure 2A:
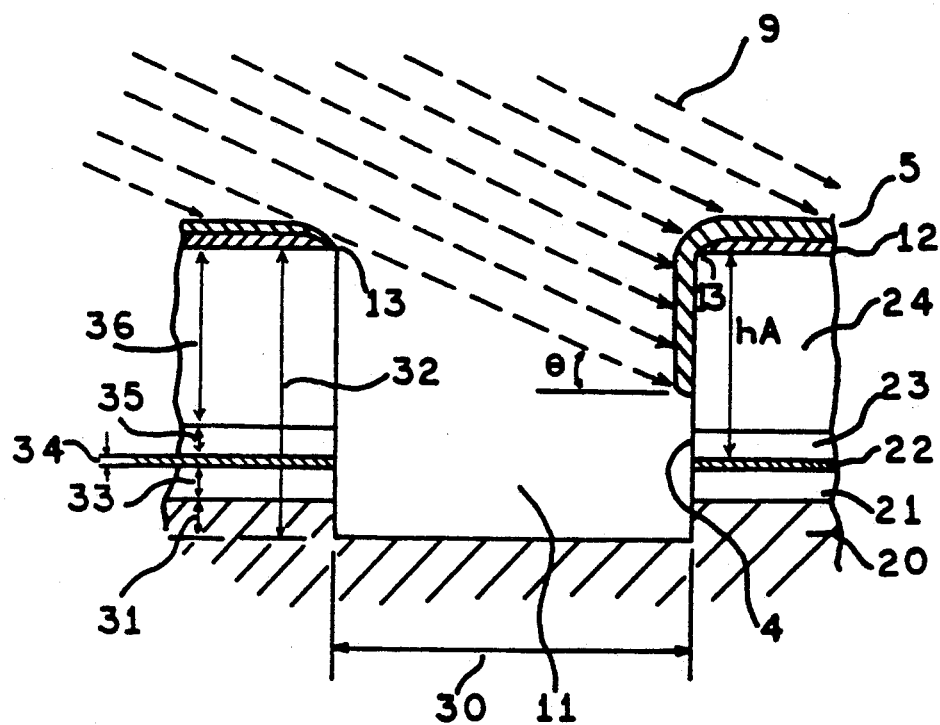
FIGS. 2(a) and 2(b) are cross-sectional views taken along the corresponding lines of FIG. 1 illustrating a coating method according to an embodiment of the invention.
Figure 2B:
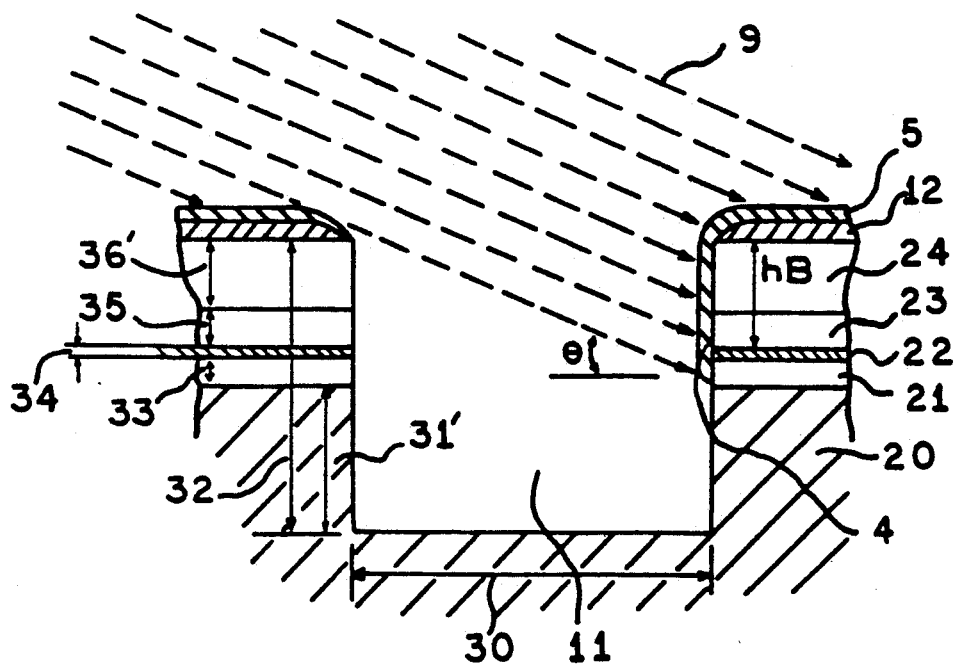

A method in which the structure of FIG. 1 is employed to apply different coatings to the facets of light-emitting regions 2 and 3 on side wall 4 is illustrated in FIGS. 2(a) and 2(b). These figures are cross-sectional views taken along lines 2(a)-2(a) and 2(b)-2(b) of FIG. 1. In both of FIGS. 2(a) and 2(b), a stream of an evaporated coating material 9 is directed toward one of the side wall surfaces 4 across the edge 13 at the opposite side wall surface 4. The stream forms an angle Θ with respect to the front surface of the substrate. At that angle, the relatively "high" portion of edge 13 shadows a portion of the side wall surface 4 opposite the stream 9 of evaporated coating material while the relatively "low" portion of edge 13 does not shadow the opposite side wall surface portion. Because the respective depths of the light-emitting regions 2 and 3 on side wall surface 4 are different with respect to the adjacent portion of edge 13, i.e., the edge 13 has relatively "high" and "low" portions, the coating material is selectively applied to the light-emitting region facets on side wall 4. In other words, in the example illustrated in FIGS. 2(a) and 2(b), the relatively deep facet of light-emitting region 3 on side wall 4 having a depth $h_A$ measured from the front surface of the wafer is not covered by the coating material. On the other hand, the relatively shallow facet of light-emitting region 2, which has a depth $h_B$ measured from the bottom of groove 10, is covered by the coating material. Of course, the active layer 22 in which the light-emitting regions are disposed is formed at the same time throughout the wafer and has the same depth from the front surface of the wafer. However, the formation of grooves 10 and 11 of different depths changes the effective depths of different portions of the active layer 22 as illustrated in FIGS. 2(a) and 2(b).

A specific dimensional example of the structure of FIG. 1 can best be described with respect to FIGS. 2(a) and 2(b). In the example, the depth of grooves 10 may be three microns measured from the front surface of the wafer. Groove 11 has a width 30 of ten microns and a depth 32 of eight microns measured from the front surface of the wafer to the bottom of groove 11 where it does not intersect grooves 10. Groove 11 exposes, as part of side wall surface 4, a portion of the wafer 20 to a depth 31 of one micron in FIG. 2(a) and a depth 31' of four microns in FIG. 2(b) because of the presence of groove 10. In this example, the lower cladding layer 21 has a thickness 33 of about 1 micron, the active layer 22 has a thickness 34 of about 0.07 micron, the upper cladding layer 23 has a thickness 35 of about 1 micron, and the contacting layer 24 has a thickness of about five microns. Thus, the three micron depth of groove 10 does not penetrate into the upper cladding layer 23. With these dimensions, if the angle Θ is about 22 degrees, then the facets of the light-emitting regions 2 on side wall surface 4 opposite corresponding grooves 10 will be coated whereas the facets of the light-emitting regions 3 on side wall surface 4 will not be coated.

After this coating is completed, the removal of photoresist layer 12 lifts off the coating material that accumulates on the front surface of the structure. As is apparent from FIGS. 2(a) and 2(b), if the angle Θ is increased sufficiently, for example, to 32 degrees or more in the specific example described, the facets of both of the light-emitting regions on the side wall surface will be coated with the same material, either before or after the selective coating that is illustrated in FIGS. 2(a) and 2(b).

A particular advantage of the invention lies in the simultaneous coating of a selected portion of a large number of facets of light-emitting regions disposed on the same surface. As indicated in FIG. 1, a plurality of such facets is exposed by the formation of groove 11. By the formation of multiple grooves 11, a still larger number of light-emitting region facets are simultaneously exposed. A selected number of those facets can be coated simultaneously using the process illustrated in FIGS. 2(a) and 2(b). By directing the stream of evaporated coating material first in one direction and then in an opposite direction, selected facets of the light-emitting regions disposed on opposed side wall surfaces are successively, selectively coated. Thereafter, the wafer is severed by conventional dicing or fracturing techniques using the grooves 11 that are already present to separate the large number of light-emitting structures into individual devices. The novel technique of coating so many selected light-emitting region facets simultaneously eliminates the necessity of mechanically aligning a separate mask with some of the light-emitting region facets, as in the prior art illustrated in FIG. 8.

The specific embodiments of the invention described with respect to FIGS. 1, 2(a), and 2(b) employ straight, generally parallel groups of intersecting grooves of generally rectangular or trapezoidal cross-section. It is not necessary that the grooves lie along straight lines nor that they extend the full width of a wafer. The grooves may be foreshortened, i.e., have a recessed shape, or have still another shape and a different cross-section, so long as the grooves intersect each other and form an edge 13 that has a variable height relative to the front surface of the wafer so that the edge can selectively shadow some of the light-emitting region facets during the coating process.

Figure 3:
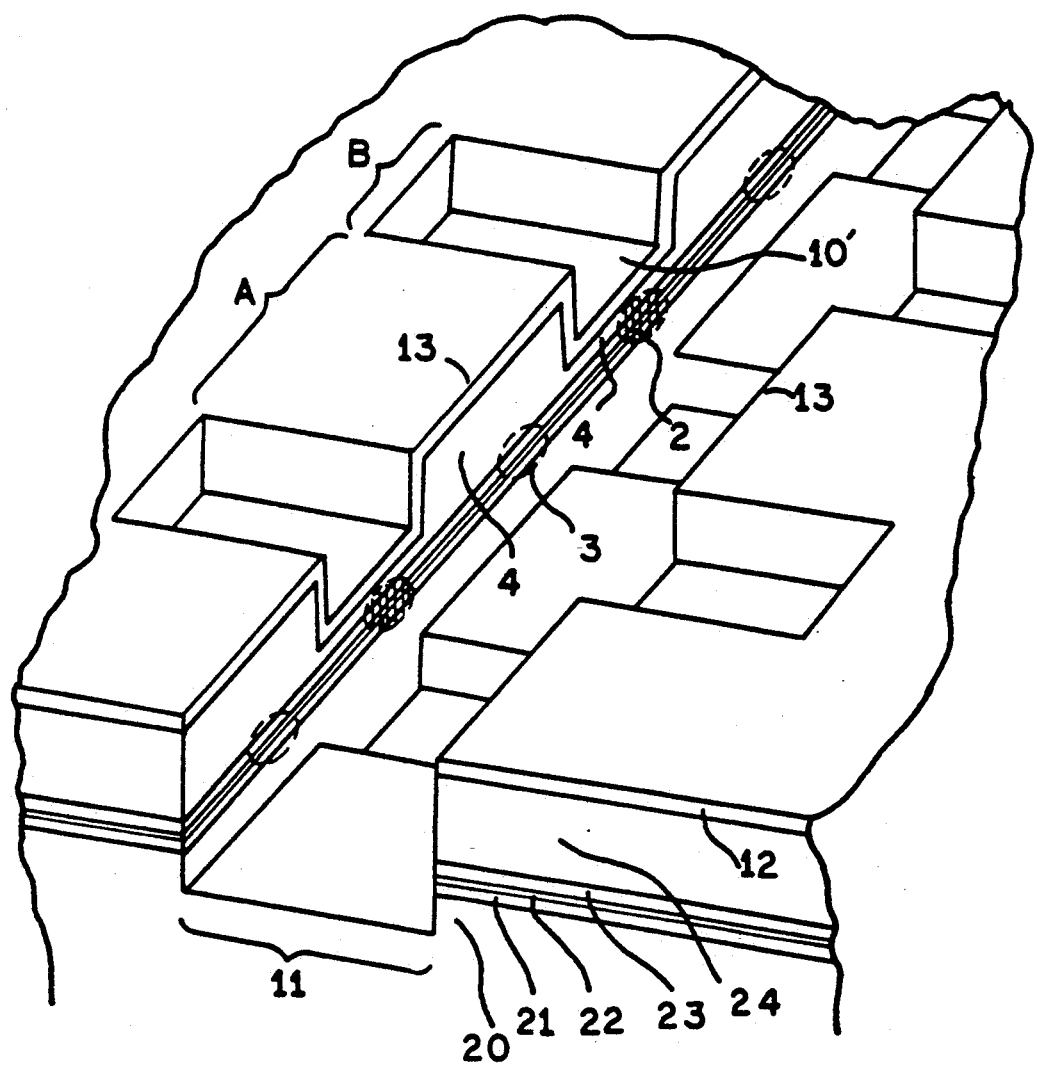
FIG. 3 is a perspective view of a portion of a semiconductor wafer for forming a plurality of light-emitting devices and prepared for coating according to another embodiment of the invention.

An example of a modified embodiment of the invention is shown in FIG. 3 which is similar to FIG. 1. However, in FIG. 3 the grooves 10' have end walls, like recesses, and do not extend over the entire width of the wafer. Grooves 10' are shown disposed on both sides of groove 11 but it is only necessary for those grooves 10' to lie at one side of the groove 11 if selective coating is to take place only along the one side wall surface 4 opposite the grooves 10'.

Figure 4:
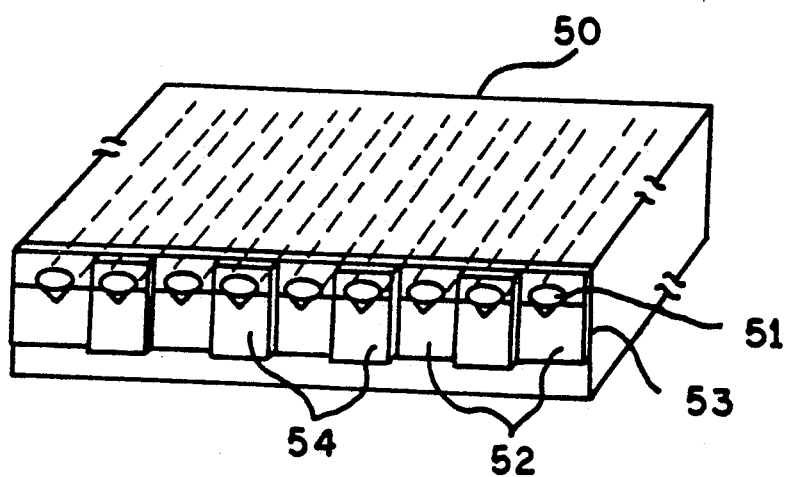
FIG. 4 is a perspective view of a phased array of lasers coated in accordance with an embodiment of the invention.

In FIG. 4, the facets of a phased array laser diode chip 50 that has been selectively coated according to the invention and separated from a wafer including a plurality of such arrays is shown in a perspective view. The laser diode array 50 includes a plurality of generally parallel light-emitting regions, each having a facet 51. All light-emitting region facets 51 have been coated with a one-half wavelength coating 52, i.e., a coating having an effective thickness, considering the wavelength of the emitted light and the index of refraction of the coating of one-half wavelength. According to the description of the invention with respect to FIGS. 2(a) and 2(b), this coating 52 has been deposited by choosing a relatively large angle Θ with respect to the front surface of the wafer so that the entire surface 53 of the array which includes the facets 51 is covered by coating 52 from the top of the array, i.e., the top of a groove, to a position near the bottom of that groove corresponding to groove 11 of FIG. 1. Thereafter, a second coating 54 is selectively applied to alternating light-emitting region facets 51. That coating 54 is selectively deposited by the formation of grooves, corresponding to grooves 10 of FIG. 1, opposite alternating light-emitting region facets and directing a stream of evaporated coating material across an edge including those grooves at an angle smaller than that used in depositing coating 52. That smaller angle causes the relatively higher edges between the grooves corresponding to grooves 10 of FIG. 1 to shadow alternating light-emitting region facets while the intervening regions are coated. The second coating 54, through its thickness and optical characteristics, may introduce a controlled phase shift in the light emitted from the coated, alternating light-emitting region facets to produce a desired light pattern when the light emitted from all of the light-emitting regions 51 merges at a distance from the array 50.

Figure 5:
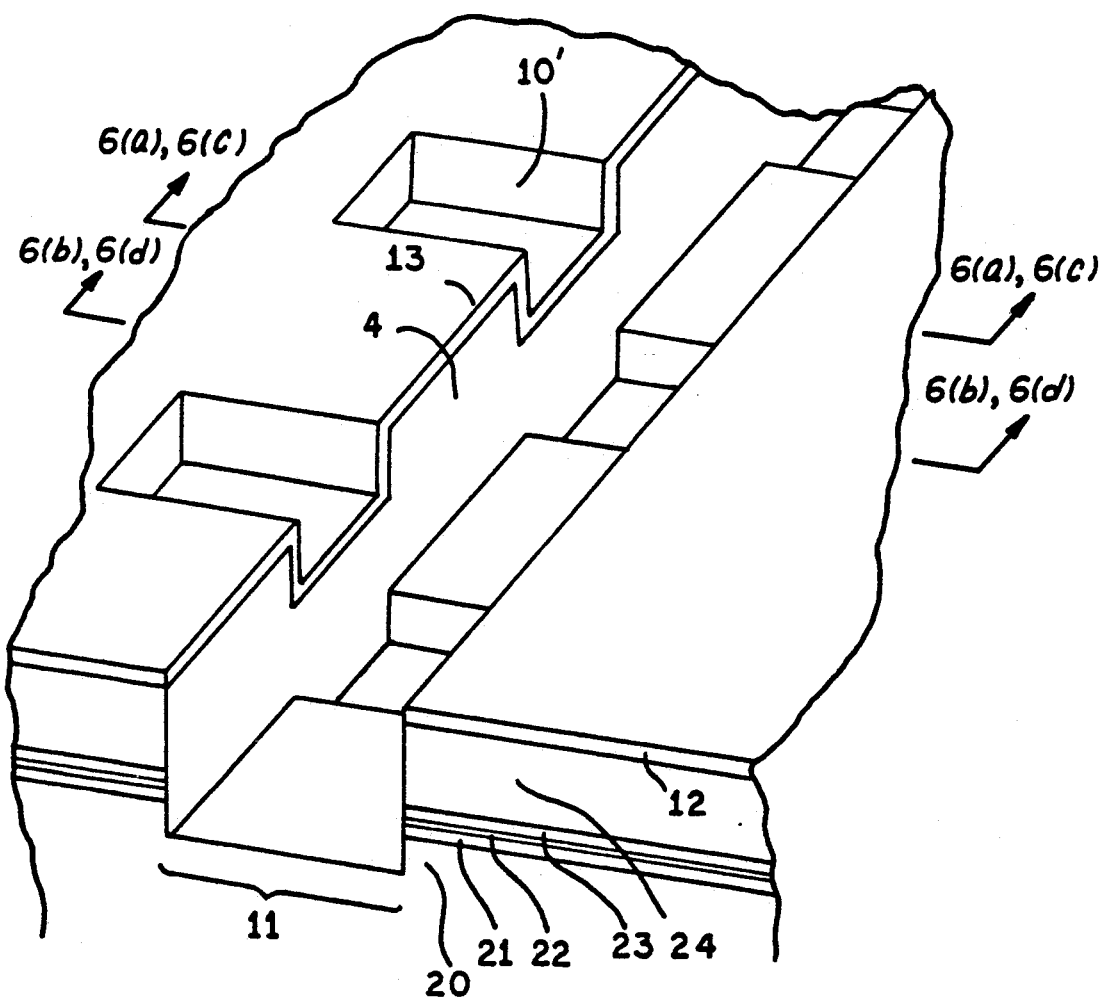
FIG. 5 is a perspective view of a portion of a semiconductor wafer for forming a plurality of light-emitting devices and prepared for coating according to still another embodiment of the invention.

One method of depositing different coatings over different light-emitting region facets according to the invention is illustrated in FIGS. 5 and 6(a)–6(d). FIG. 5 is similar to FIG. 1 except that grooves 10' have end walls rather than the longer grooves 10 of FIG. 1. The grooves 10', in this example, are disposed only at one side wall surface 4 formed by groove 11.

Figure 6A:
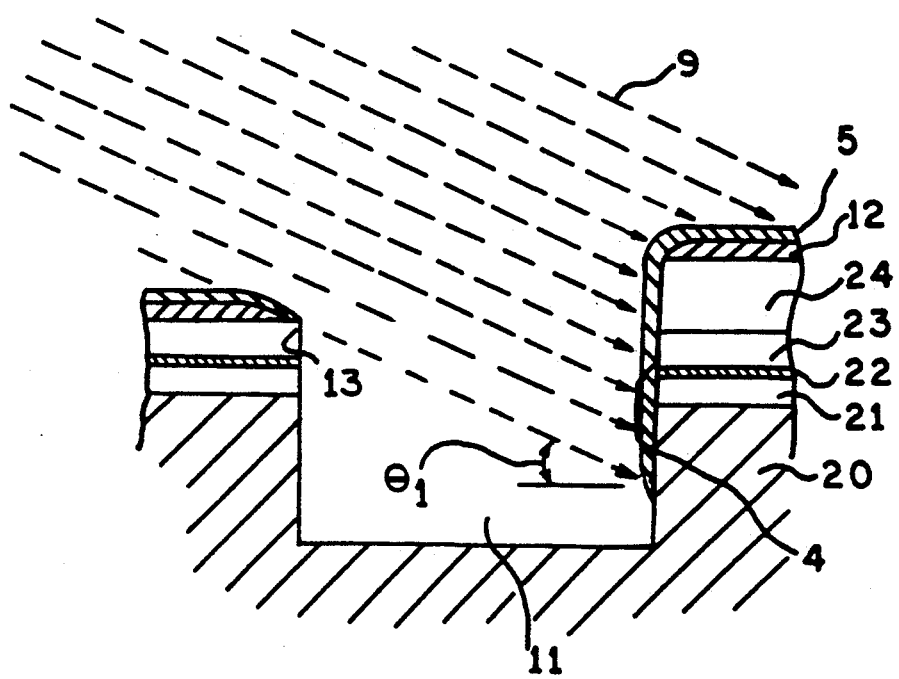
FIGS. 6(a)–6(d) are cross-sectional views taken along the corresponding lines of FIG. 5 illustrating a coating method according to an embodiment of the invention.
Figure 6B:
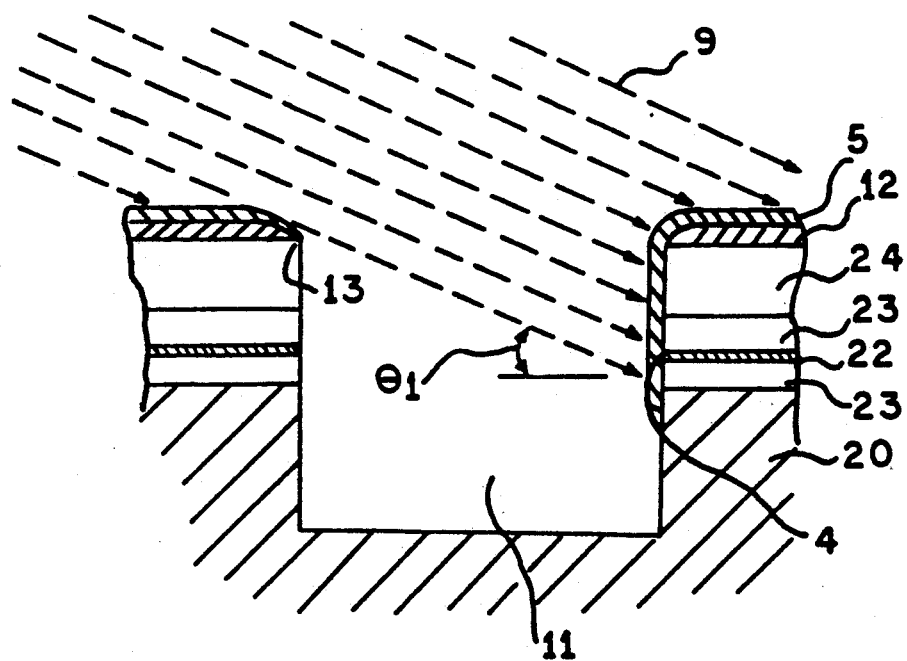
Figure 6C:
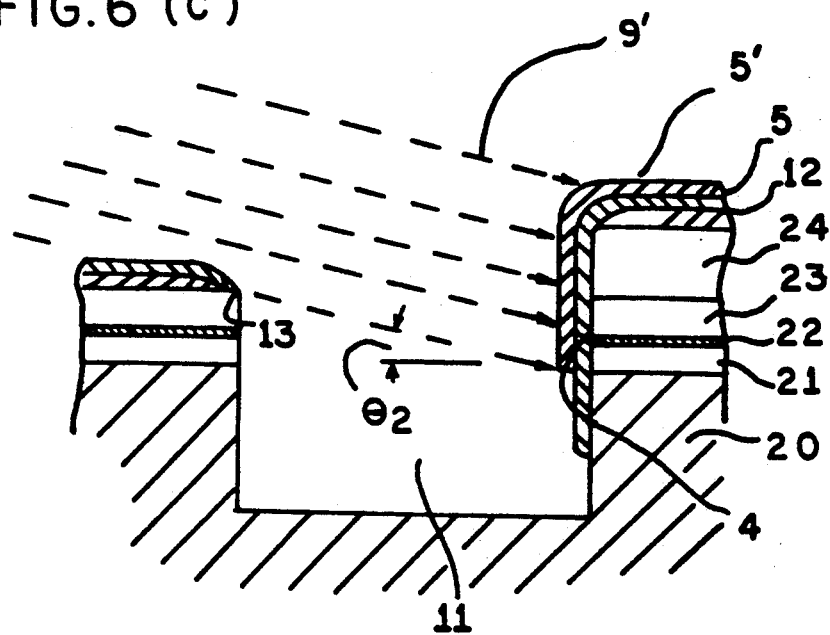
Figure 6D:
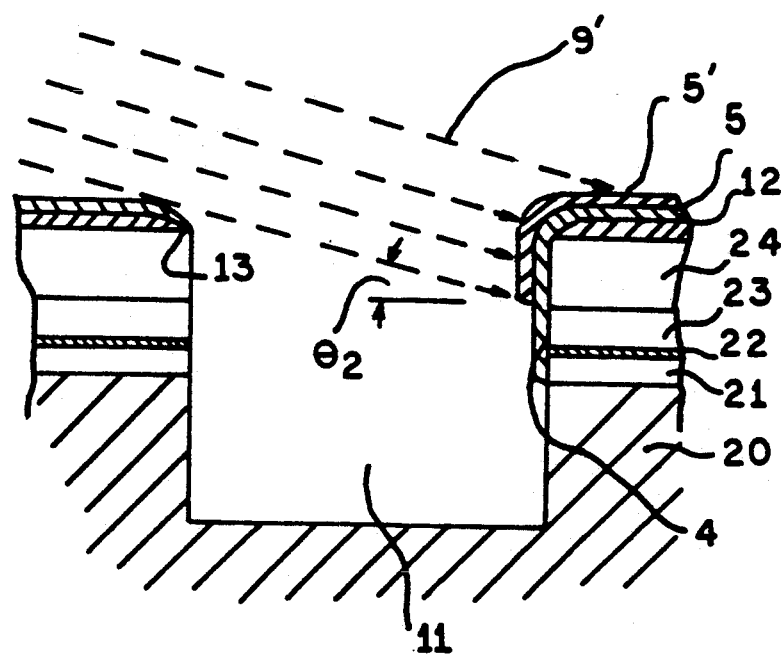

In the first step of the coating process, illustrated in FIGS. 6(a) and 6(b), a stream 9 of an evaporated first coating material is directed against the side wall surface 4 of groove 11 at an angle $\Theta_1$ with respect to the surface of wafer 20. That angle is chosen considering the depth of grooves 10' so that the resulting coating 5 covers all of the facets of the light-emitting regions 2 wherever disposed on the side wall surface 4. That coating 5 is analogous to coating 52 of the laser diode array of FIG. 4, covering each of the light-emitting region facets. In the second step of the coating procedure, illustrated in FIGS. 6(c) and 6(d), a second stream 9' of an evaporated second coating material is directed across edge 13 at an angle $\Theta_2$ with respect to the front surface of the substrate. $\Theta_2$ is a smaller angle than $\Theta_1$ so that the stream 9' does not extend in depth on side wall surface 4 as far as evaporated beam 9. As a result, a coating 5' is deposited on only part of coating 5. Where the active region 22 is disposed opposite grooves 10', coating 5' covers the facets of the light-emitting regions. Elsewhere edge 13 shadows stream 9' so that coating 5' does not extend deeply enough into groove 11 to coat the active layer 22 and facets of the corresponding light-emitting regions. As a result, a selectively coated structure including more than one coating layer, for example, of the type illustrated in FIG. 4, is obtained.

As with the structure of FIG. 1, after the coating process of FIGS. 4 and 6(a)–6(d) is complete, the wafer is severed into individual devices, each including one or more light-emitting region facets, having different coatings. As in the process described with respect to FIG. 1, the formation of grooves 10', like the formation of grooves 10, achieves a self alignment between the coating mask, i.e., the crenelated or battlement edge 13, that is an integral part of the wafer from which the devices are made and the facets of the light-emitting regions, avoiding the difficult prior art mechanical mask alignment procedure illustrated in FIG. 8. The multiple coating process illustrated in FIGS. 5 and 6(a)–6(d) permits the selective deposition of a relatively high reflectance coating on parts of a relatively low reflectance coating that covers a larger surface.

Figure 7:
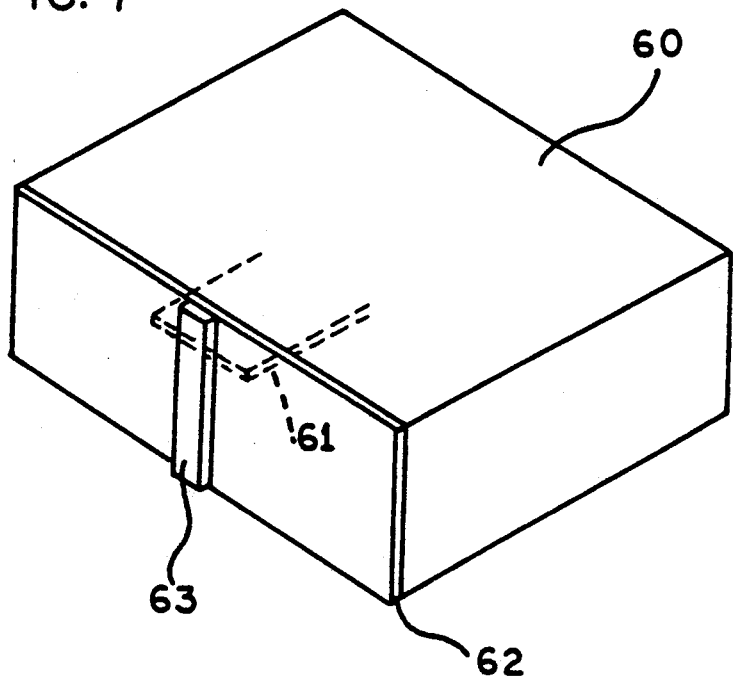
FIG. 7 is a perspective view of a semiconductor laser having a relatively wide active region partially coated in accordance with yet another embodiment of the invention.

FIG. 7 illustrates yet another structure produced according to the invention. In FIG. 7, a laser diode chip 60 includes a relatively wide optical resonator, i.e., light-emitting region, 61. In order to stabilize the oscillation mode of the laser diode, it is desirable to deposit a relatively high reflectance coating only on a portion of the facet of the relatively wide resonator. However, to achieve laser oscillation, it is necessary to deposit a relatively low reflectance coating, such as coating 62, over the entire facet. The desired result is achieved while the laser diode is still in a wafer form by forming a groove opposite a portion of a side wall surface on which the facet of resonator 61 is exposed. First, a relatively low reflectance coating 62 is generally deposited over the entire side wall surface according to the process generally illustrated in FIGS. 6(a) and 6(b). Upon the completion of that first coating, a relatively high reflectance coating 63 is deposited only on a portion of the facet of the resonator 61 by directing a stream of an evaporated coating material at a second, smaller angle over the edge to selectively deposit the film 63.

Although the present invention has been described with respect to selective coating of semiconductor devices that emit light, it can be applied to any semiconductor device that requires selective coating, such as a photocell or other light detector. Therefore, the references in the foregoing description and in the following claims to light-emitting region facets encompasses light interacting surfaces, i.e., facets, through which internally generated light is radiated or externally produced light is received.

We claim:

1. A method of selectively coating one of at least two spaced apart facets of respective light-emitting regions disposed on the same surface of a semiconductor device formed in a semiconductor wafer comprising:

preparing a plurality of layers in and adjacent a front surface of a semiconductor wafer for forming a plurality of light-emitting semiconductor devices from the wafer, each light-emitting device including first and second spaced apart light-emitting regions, each region having a facet through which light is emitted, the facets being disposed on a common surface;

forming at least one groove in the semiconductor wafer extending to a first depth from the front surface;

forming a second groove in the semiconductor wafer transverse to and intersecting the first groove and extending from the front surface deeper into the semiconductor wafer than the first groove to expose first and second side wall surfaces of the second groove generally transverse to the front surface, the first side wall surface including the facets of the first and second light-emitting regions, the first groove being aligned with the first light-emitting region facet opposite the first side wall surface, the second side wall surface intersecting the front surface to define a first edge intersecting the first groove; and directing a stream of an evaporated coating material across the first edge at such an angle with respect to the front surface so that the first edge shadows the second light-emitting region facet on the first side wall surface and prevents the coating material from reaching and coating the facet of the second light-emitting region while the coating material flows past the first groove at the first edge and reaches and coats the facet of the first light-emitting region on the first side wall surface.

2. The method of claim 1 including:

forming the second groove so that the first groove extends from both of the first and second side wall surfaces, the second side wall surface including facets of first and second light-emitting regions of a second device, the first side wall surface intersecting the front surface to define a second edge intersecting the first groove; and directing a stream of an evaporated coating material across the second edge at such an angle with respect to the front surface that the second edge shadows the facet of the second light-emitting region on the second side wall surface and prevents the coating material from reaching and coating the facet of the second light-emitting region on the second side wall surface while the coating material flows past the first groove at the second edge and reaches and coats the facet of the first light-emitting region on the second side wall surface.

3. The method of claim 1 wherein at least one of the devices comprises a laser for producing a relatively high power output at the facet of the first light-emitting region and for producing a relatively low power output at the facet of the second light-emitting region and wherein preparing a plurality of layers comprises successively forming a first cladding semiconductor layer, an active semiconductor layer, a second cladding semiconductor layer, and a semiconductor contacting layer, the first groove is formed only in the contacting layer, and the second groove penetrates through the contacting, active, and first and second cladding layers.

4. The method of claim 3 including depositing a relatively low reflectance film on the facet of the first light-emitting region.

5. The method of claim 1 including, after coating the facet of the first light-emitting region, severing the wafer along the second groove into a plurality of individual devices.

6. The method of claim 1 including forming a plurality of said first and second grooves in the wafer to expose a plurality of pairs of facets of first and second light-emitting regions on the first side wall surfaces of the respective second grooves, selectively coating the respective facets of the first light-emitting regions on the first side wall surfaces of the respective second grooves, and severing the wafer along the respective second grooves into a plurality of individual devices.

7. The method of claim 1 including depositing a photoresist on the front surface of the wafer after forming the first groove but before forming the second groove and removing the photoresist layer after coating the facets of the first light-emitting region to remove coating material from the front surface.

8. A method of selectively coating one of at least two spaced apart facets of respective light-emitting regions disposed on the same surface of a semiconductor device formed in a semiconductor wafer comprising:
preparing a plurality of layers in and adjacent a front surface of a semiconductor wafer for forming a plurality of light-emitting semiconductor devices from the wafer, each light-emitting device including first and second spaced apart light-emitting regions, each region having a facet through which light is emitted, the facets being disposed on a common surface;
forming at least one groove in the semiconductor wafer extending to a first depth from the front surface;
forming a second groove in the semiconductor wafer transverse to and intersecting the first groove and extending from the front surface deeper into the semiconductor wafer than the first groove to expose first and second side wall surfaces of the second groove generally transverse to the front surface, the first side wall surface including the facets of the first and second light-emitting regions, the first groove being aligned with the first light-emitting region facet opposite the first side wall surface, the second side wall surface intersecting the front surface to define a first edge intersecting the first groove;
directing a stream of an evaporated first coating material across the first edge at a first, relatively large angle with respect to the front surface so that the first coating material reaches and coats the facets of both of the first and second light-emitting regions on the first side wall surface; and
directing a stream of an evaporated second coating material across the first edge at a second, relatively small angle with respect to the front surface so that the first edge shadows the second light-emitting region facet on the first side wall surface and prevents the second coating material from reaching and coating the facet of the second light-emitting region while the second coating material flows past the first groove at the first edge and reaches and coats the facet of the first light-emitting region on the first side wall surface.

9. The method of claim 8 including:
forming the second groove so that the first groove extends from both of the first and second side wall surfaces, the second side wall surface including facets of first and second light-emitting regions of a second device, the first side wall surface intersecting the front surface to define a second edge intersecting the first groove; and
directing a stream of an evaporated coating material across the second edge at such an angle with respect to the front surface that the second edge shadows the facet of the second light-emitting region on the second side wall surface and prevents the coating material from reaching and coating the facet of the second light-emitting region on the second side wall surface while the coating material flows past the first groove at the second edge and reaches and coats the facet of the first light-emitting region on the second side wall surface.

10. The method of claim 8 wherein at least one of the devices comprises a laser for producing a relatively high power output at the facet of the first light-emitting region and for producing a relatively low power output at the facet of the second light-emitting region and wherein preparing a plurality of layers comprises successively forming a first cladding semiconductor layer, an active semiconductor layer, a second cladding semiconductor layer, and a semiconductor contacting layer, the first groove is formed only in the contacting layer, and the second groove penetrates through the contacting, active, and first and second cladding layers.

11. The method of claim 10 including depositing a relatively low reflectance film on the facet of the first light-emitting region.

12. The method of claim 8 including, after coating the facet of the first light-emitting region with the second coating material, severing the wafer along the second groove into a plurality of individual devices.

13. The method of claim 8 including forming a plurality of said first and second grooves in the wafer to expose a plurality of pairs of facets of first and second light-emitting regions on the first side wall surfaces of the respective second grooves, selectively coating the respective facets of the first light-emitting regions on the first side wall surfaces of the respective second grooves, and severing the wafer along the respective second grooves into a plurality of individual devices.

14. The method of claim 8 including depositing a photoresist on the front surface of the wafer after forming the first groove but before forming the second groove and removing the photoresist layer after coating the facets of the first light-emitting region to remove coating material from the front surface.

15. The method of claim 8 including coating the facets of both of the first and second light-emitting regions with a first coating having a thickness approximately one-half the wavelength of light emitted by the device and coating the facet of the first light-emitting region with a second coating producing a controlled phase shift of light emitted by the device that passes through the second coating.

16. A method of coating a portion of a facet of a light-emitting region on a surface of a semiconductor device formed in a semiconductor wafer comprising:
   preparing a plurality of layers in and adjacent a front surface of a semiconductor wafer for forming a plurality of light-emitting semiconductor devices from the wafer, each light-emitting device including a relatively wide light-emitting region having a facet through which light is emitted;
   forming at least one groove in the semiconductor wafer extending to a first depth from the front surface;
   forming a second groove in the semiconductor wafer transverse to and intersecting the first groove and extending from the front surface deeper into the semiconductor wafer than the first groove to expose first and second side wall surfaces of the second groove generally transverse to the front surface, the first side wall surface including at least one relatively wide light-emitting region facet, the first groove being narrower than and aligned with a first portion of the light-emitting region facet on the first side wall surface, the second side wall surface intersecting the front surface to define a first edge intersecting the first groove.; and
   directing a stream of an evaporated first coating material across the first edge at a first, relatively low angle with respect to the front surface so that the first edge shadows the light-emitting region facet outside the first portion of the relatively wide light-emitting region facet on the first side wall surface and prevents the first coating material from reaching and coating the light-emitting region facet outside the first portion while the first coating material flows past the first groove at the first edge and reaches and coats the first portion of the light-emitting region facet on the first side wall surface.

17. The method of claim 16 including, after coating the first portion of the light-emitting region facet, severing the wafer along the second groove into a plurality of individual devices.

18. The method of claim 16 including depositing a photoresist on the front surface of the wafer after forming the first groove but before forming the second groove and removing the photoresist layer after coating the first light-emitting region facet to remove coating material from the front surface.

19. The method of claim 16 including, before depositing the first coating material, directing a stream of an evaporated second coating material across the first edge at a second, relatively high angle with respect to the front surface so that the second coating material reaches and coats all of the light-emitting region facet.

* * * * *